(12) United States Patent
Kraemer et al.

(10) Patent No.: US 11,653,465 B2
(45) Date of Patent: May 16, 2023

(54) HOUSING ASSEMBLY AND HOUSING ASSEMBLY METHOD

(71) Applicant: TE Connectivity Germany GmbH, Bensheim (DE)

(72) Inventors: Christoph Kraemer, Speyer (DE); Gerhard Riedl, Speyer (DE); Bernd Geisselmann, Speyer (DE)

(73) Assignee: TE Connectivity Germany GmbH, Bensheim (DE)

( * ) Notice: Subject to any disclaimer, the term of this patent is extended or adjusted under 35 U.S.C. 154(b) by 58 days.

(21) Appl. No.: 17/313,147

(22) Filed: May 6, 2021

(65) Prior Publication Data

US 2021/0352815 A1 Nov. 11, 2021

(30) Foreign Application Priority Data

May 6, 2020 (EP) .................................... 20173189

(51) Int. Cl.
*H05K 5/00* (2006.01)
*H05K 5/03* (2006.01)

(52) U.S. Cl.
CPC .............. *H05K 5/03* (2013.01); *H05K 5/006* (2013.01); *H05K 5/0052* (2013.01)

(58) Field of Classification Search
CPC ............................ H05K 5/006; H05K 5/0052
See application file for complete search history.

(56) References Cited

U.S. PATENT DOCUMENTS

| | | | | |
|---|---|---|---|---|
| 2018/0014418 A1* | 1/2018 | Kang | ................... | H05K 5/0047 |
| 2020/0014161 A1* | 1/2020 | Liao | ..................... | H01R 24/60 |
| 2020/0113068 A1* | 4/2020 | Riedl | .................... | H05K 7/142 |
| 2020/0389992 A1* | 12/2020 | Kanatani | .............. | H05K 7/1462 |
| 2021/0251088 A1* | 8/2021 | Su | ........................ | B29C 65/606 |

FOREIGN PATENT DOCUMENTS

| | | |
|---|---|---|
| EP | 0984527 A2 | 3/2000 |
| EP | 3609305 A1 | 2/2020 |

* cited by examiner

*Primary Examiner* — Hung V Ngo
(74) *Attorney, Agent, or Firm* — Barley Snyder

(57) ABSTRACT

A housing assembly for a component includes a base portion having a holding element, a cover portion having an actuation element, and a carrier element carrying the component. The holding element holds the carrier element by engaging with the actuation element. The actuation element applies a contact force on the holding element and is adjustable with respect to the holding element in at least one direction when the holding element is engaged with the actuation element.

18 Claims, 5 Drawing Sheets

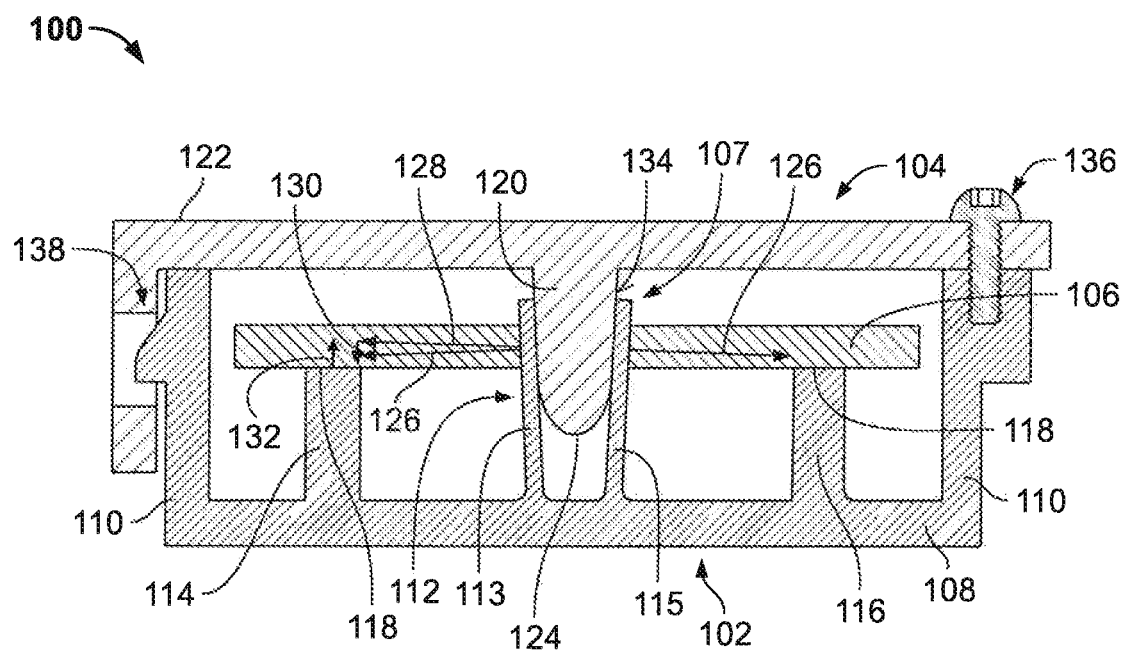
Fig. 1
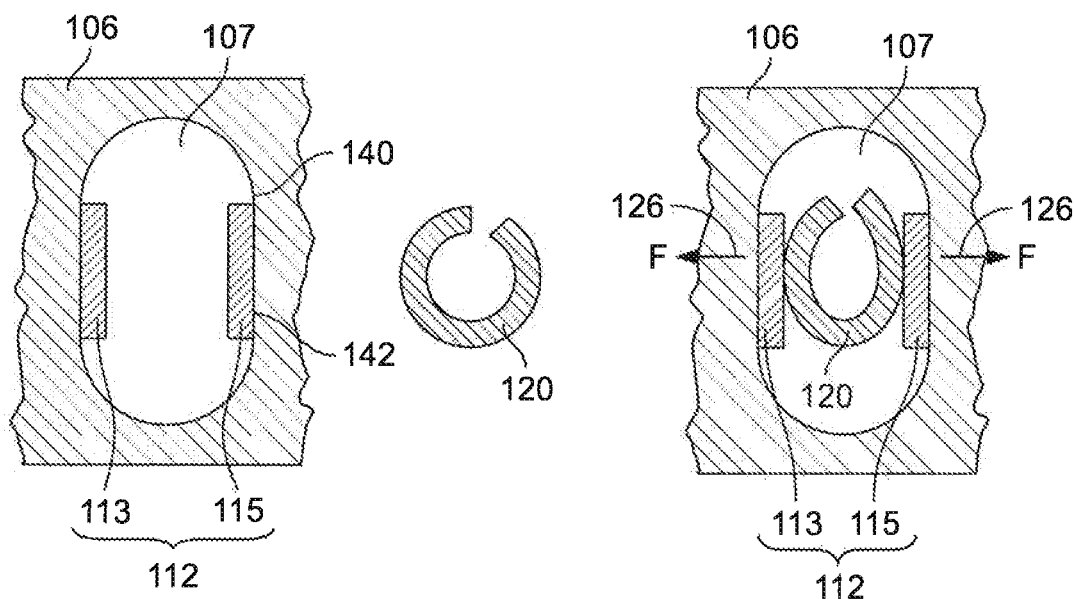
Fig. 2
Fig. 3

0
HOUSING ASSEMBLY AND HOUSING ASSEMBLY METHOD

CROSS-REFERENCE TO RELATED APPLICATIONS

This application claims the benefit of the filing date under 35 U.S.C. § 119(a)-(d) of European Patent Application No. 20173189.0, filed on May 6, 2020.

FIELD OF THE INVENTION

The present invention relates to a housing assembly and, more particularly, to a housing assembly for at least one component.

BACKGROUND

In mechatronic systems, such as automotive sensorics, technical assemblies like sensors or plugs are used for detecting environmental conditions. For example, such technical assemblies include a plurality of electronic components like resistors, integrated circuits, and connectors for performing the intended circuit functions. By attaching and conductively coupling the electronic components to a carrier element, for instance a printed circuit board (PCB), the electronic components become the technical assembly. Besides providing interconnections between the electronic components, the carrier element should also provide firm hold, so that the operation of the electronic components is not overly disturbed due to externally induced shocks and vibrations.

In order to prevent other disturbing external influences, it is a requirement to stably integrate the technical assembly into a housing assembly. Furthermore, as the dimension and size of electronic components are reduced more and more for achieving higher functional densities of the technical assembly, it is an important issue that the carrier elements and the holding mechanisms for holding the carrier elements also occupy less space, so as to provide a higher density of electronic connections for each housing assembly. On the other hand, the carrier elements should also provide a high mechanical integrity and durability against thermal or vibrational loading and prevention of electromagnetic interference (EMI).

Hence, it is an important issue to mount the carrier element stably in the housing assembly, so that an electronic or other technical component mounted on the carrier element is protected against environmental influences and can absorb shocks and vibrations introduced from the outside of the housing assembly. Otherwise, these vibrations or shocks can easily induce deformation of the carrier material or the interconnections of the attached components, which leads to a lower durability of the technical assembly.

A method for fixing a perforated plate in a plastic housing is for example known from EP 0 984 527 A2. Hereby, the perforated plate is held by an expanding rivet, which includes two segments for acting in a radial direction and two segments for acting in an axial direction. The rivet joint between the perforated plate and the expanding rivet is actuated by inserting a corresponding expanding mandrel into the expanding rivet.

Further, EP 3 609 305 A1 discloses a housing assembly and a method for fixing a printed circuit board in a housing. Hereby, the assembly comprises a first housing portion with a first retaining element extending upwards from a base of the first housing portion and a second housing portion with a second retaining element extending downwards from a cover of the second housing portion. When fixing the first housing portion with the second housing portion, the open end of the first retaining element receives a distal end of the second retaining element, thereby exerting a force in a radial direction on segmented ends of the first retaining element. As a result, the segmented ends of the first retaining elements are caused to creep onto the PCB, thus fixing the PCB in the housing.

There is still a need, however, for improvement of the fixation of a carrier element in a housing assembly, especially with respect to tolerance compensations between the carrier element, a holding element for holding the carrier element, and an actuation element for activating the holding element.

SUMMARY

A housing assembly for a component includes a base portion having a holding element, a cover portion having an actuation element, and a carrier element carrying the component. The holding element holds the carrier element by engaging with the actuation element. The actuation element applies a contact force on the holding element and is adjustable with respect to the holding element in at least one direction when the holding element is engaged with the actuation element.

BRIEF DESCRIPTION OF THE DRAWINGS

The invention will now be described by way of example with reference to the accompanying Figures, of which:

FIG. 1 is a sectional view of a housing assembly according to a first embodiment;

FIG. 2 is a sectional top view of a holding element and an actuation element before assembly;

FIG. 3 is a sectional top view of the holding element and the actuation element of FIG. 2 engaged with each other;

DETAILED DESCRIPTION OF THE EMBODIMENT(S)

Figure 4:
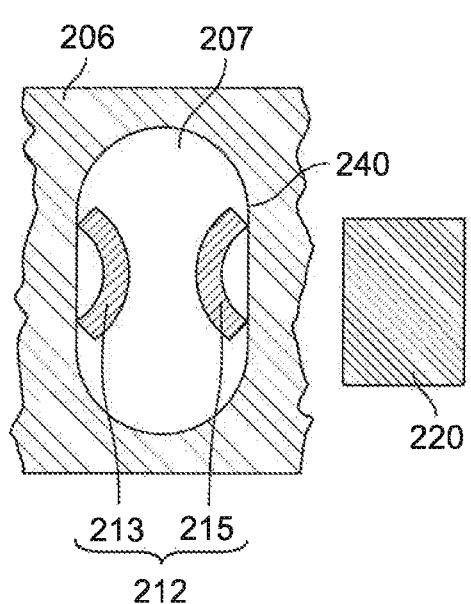
FIG. 4 is a sectional top view of a holding element and an actuation element according to another embodiment before assembly.

In the following, the invention is described in more detail in reference to the attached figures and drawings. Similar or corresponding details in the figures are marked with the same reference numerals.

The accompanying drawings are incorporated into the specification and form a part of the specification to illustrate several embodiments of the present invention. These drawings, together with the description, serve to explain the principles of the invention. The drawings are merely for the purpose of illustrating the examples of how the invention can be made and used, and are not to be construed as limiting the invention to only the illustrated and described embodiments. Furthermore, several aspects of the embodiments may form—individually or in different combinations—solutions according to the present invention. The following described embodiments can thus be considered either alone or in an arbitrary combination thereof. The described embodiments are merely possible configurations, and it must be borne in mind that the individual features can be provided independently of one another, or can be omitted altogether while implementing this invention. Further features and advantages will become apparent from the following, more particular description of the various embodiments of the invention, as illustrated in the accompanying drawings.

The present invention will now be explained in more detail with reference to the Figures and firstly referring to FIG. 1.

FIG. 1 shows a housing assembly 100 according to a first embodiment of the present invention. It has to be noted that, in all the Figures, dimensions are merely of illustrative purpose and are not to scale in order to illustrate the idea according to the present invention. The housing assembly 100 comprises a base portion 102, a cover portion 104, and a carrier element 106. The carrier element 106 carries at least one technical component, such as an electronic component, which is integrated in the housing assembly 100 in order to protect the technical component from the environmental conditions. For example, the carrier element 106 may carry a plurality of technical components, which form a technical assembly, such as a sensor, an integrated circuit, a controller, a motor or a connector.

The carrier element 106 may for example be a printed circuit board, to which at least one electronic component is attached, or a lead frame, to which the at least one electronic component or at least one other technical component is attached. However, it is clear for the skilled person that also any other flat carrier, which is suitable for carrying at least one electrical or other technical component, can be used as carrier element 106. For arranging the carrier element 106 in the base portion 102, the carrier element 106 may comprise an opening 107, as shown in FIG. 1.

As shown in FIG. 1, the base portion 102 comprises a base element 108 and side walls 110. For holding the carrier element 106, the base portion 102 comprises a holding element 112, which extends upwards from the base portion 102 towards the cover portion 104. When the carrier element 106 is arranged in the base portion 102, the holding element 112 is inserted through the opening 107 of the carrier element 106 and the holding element 112 protrudes through the opening 107. For example, the holding element 112 comprises a first clip element 113 and a second clip element 115, which each protrude through the opening 107 in the assembled state.

Stabilization of the carrier element 106 is provided by a support element, which comprises a first support part 114 and a second support part 116 shown in FIG. 1. Each of the support parts 114 and 116 provides a support region 118 at a peripheral ending, which is in contact with the carrier element 106. The first support part 116 and the second support part 118 extends upwards from the base element 108 towards the cover portion 104 and are arranged separated from the holding element 112.

The cover portion 104, as shown in FIG. 1, comprises an actuation element 120 and a lid element 122. The actuation element 120 extends downwards from the lid element 122 towards the base portion 102. The actuation element 120 acts as a counterpart for the holding element 112, so that the holding element 112 holds the carrier element 106 when the holding element 112 is engaged with the actuation element 120.

The actuation element 120 can be formed, for example, as a pin, and in an embodiment in conical form, so that the actuation element 120 is tapered towards a peripheral region 124. However, the actuation element 120 may also have other geometries in line with the principles according to the present invention, as will be described later on.

As shown in FIG. 1, the housing assembly 100 is assembled by engaging the actuation element 120 with the holding element 112. Thereby, the actuation element 120 deforms the holding element 112 and forces the holding element 112 to apply a holding force 126 on the carrier element 106. The arrangement of the carrier element 106 in the base portion 102 is simplified, since the carrier element 106 can be prearranged by the at least one holding element 112 and the at least one support element.

For this purpose, a diameter or a width of the actuation element 120 is larger than a gap between the first clip element 113 and the second clip element 115 of the holding element 112 in an embodiment, so that the actuation element 120 displaces the clip elements 113 and 115 when the housing assembly 100 is closed. Accordingly, the actuation element 120 applies a permanent contact force onto the first clip element 113 and the second clip element 115 of the holding element 112 when the actuation element 120 is engaged with the holding element 112. Due to this contact force, the first clip element 113 and the second clip element 115 are pressed radially away from the actuation element 120 in a direction towards the first support part 114 and the second support part 116.

In other words, the actuation element 120 applies a contact force on the clip elements 113 and 115 of the holding element 112, which forces the holding element 112 to press the carrier element 106 against the support region 118 of the support element. In this manner, the carrier element 106 is firmly attached or clamped between the holding element 112 and the supporting parts 114 and 116 of the support parts, so that it can withstand vibrations and shocks introduced from outside the housing assembly 100. Press fitting the actuation element 120 against the holding element 112 may further enhance the holding force between the holding element 112 and each of the supporting parts 114 and 116.

The holding mechanism will now be explained in more detail. When engaging with the holding element 112, the actuation element 120 bends the first clip element 113 and the second clip element 115 of the holding element 112 at least in a contact region with the carrier element 106. As the holding force 126 acts in a direction perpendicular to the outer surface of the clip elements 113 and 115 (as indicated by the arrow 126 in FIG. 1), the holding force 126 has a horizontal force component 128 (a radial force component) in a horizontal direction with respect to the carrier element 106 and a vertical force component 130 (an axial force component) in a vertical direction with respect to the carrier element 106. While the horizontal force component 128 points in a radial direction away from the actuation element 120 (indicated by the arrow 128), the vertical force component 130 points in an axial direction of the actuation element 120 towards the support region 118 (indicated by the arrow 130). The support region 118 of the supporting parts 114 and 116 provides a counterforce 132, which works against the vertical force component 130 of the holding force 126, and therefore tightly clamps the carrier element 106 between the holding element 112 and the support element. The arrangement dispenses the need of drilling cut-outs into the carrier element 106, thus avoiding introducing micro-cracks or other damages during the drilling process.

The ratio between the axial force component 130 and the radial force component 128 depends on the grade of tilt of the clip elements 113 and 115 in the contact region with the carrier element 106. Hence, the geometry of the actuation element 120 may be controlled in order to vary the strength of the vertical force component 130, for example, when a larger clamping strength is needed. In this case, for example, the radius or width of the actuation element 120 can be made larger compared to the gap between the first clip element 113 and the second clip element 115. Hence, an overlap or an interference between the actuation element 120 and each element of the holding element 112 in an unassembled state may not only be adjusted to control the tightness of the fit between the actuation element 120 and the holding element 112, but also to control the clamping strength between the holding element 112 and the support element.

Alternatively, an angle of taper of the actuation element 120 may be used for this purpose. An actuation element 120 tapering towards a peripheral region 124 applies a contact force to the holding element 112, which points in a direction perpendicular to the tapered surface. This forces the first clip element 113 and the second clip element 115 of the holding element 112 to follow the form of the outer surface 134 of the actuation element 120. The grade of tilt of each clip element 113 and 115 can therefore be controlled by the angle of taper of the actuation element 120. Accordingly, it is possible to enlarge vertical force component 130 of the holding force and therefore the clamping strength between the holding element 112 and the support element by enhancing the angle of taper of the actuation element 120.

For fixing the cover portion 104 to the base portion 102, fixation regions 136 and 138 are provided at the outside of the cover portion 104 and in corresponding parts of the side walls 110 of the base portion 102. Various fixation devices may be used. FIG. 1 shows, for instance, fixation by locking latches as an example for the fixation region 138 or fixation by screwing as an example for fixation region 136. However, also alternative fixation techniques, like gluing, laser welding, ultrasonic welding, infrared welding, hotplate welding, punching or embossing may be used.

Additionally, each of the fixation devices generates a fixation force that acts in a direction pointing from the cover portion 104 towards the base portion 102. As the actuation element 120 is connected through the lid element 122 with the fixation regions 136 and 138, the fixation force is transferred through the lid element 122 to the actuation element 120. For example, the fixation force applied at the fixation regions 136 and 138, and a pushback force originating from the engagement of the actuation element 120 with the holding element 112, may generate a bulge of the lid element 122. Due to an elasticity of the lid element 122, a spring force is created, which works against the bulge of the lid element 122, thus resulting in a pre-stress applied on the actuation element 120.

Hence, when the cover portion 104 is fixed to the base portion 102, the lid element 122 applies permanent pre-stress on the actuation element 120, which presses the actuation element 120 into the gap between the first clip element 113 and the second clip element 115. Thereby, the contact force between the actuation element 120 and the clip elements 113 and 115 is enhanced, which leads to higher holding forces 126 between the clip elements 113 and 115 and the support element. In an embodiment, the fixation force is made large enough that the pre-stress applied to the actuation element 120 forces the clip elements 113 and 115 of the holding element 112 to mechanically claw into the carrier element 106 or to creep onto the carrier element 106, thus providing additional fixation for the carrier element 106.

FIG. 2 shows a schematic cross-sectional top view of a first example of the holding element 112 and the actuation element 120 before the assembly of the housing assembly 100. In the example of FIG. 2, the first holding element 112 comprises a first clip element 113 and a second clip element 115, each having a rectangular cross-section. The actuation element 120 is for example a conical pin having a round cross-shape, and may be solid or hollow. As shown in FIG. 2, the actuation element 120 can also be split, at least towards the peripheral region 124.

Before engaging the holding element 112 with the actuation element 116, the carrier element 106 is arranged in the base portion 102. For this purpose, the clip elements 113 and 115 of the holding element 112 are fed through the opening 107 of the carrier element 106. As shown in FIG. 2, the opening 107 may have the form of an elongated cut-out and the clip element 113 and 115 may have a rectangular cross-shape and may be arranged to extend along the elongated sides of the elongated cut-out. The elongated sides of the elongated cut-out are, in an embodiment, made longer than the contact side 142 of the clip elements 113 and 115, which are in contact with the carrier element 106. In this manner, tolerances between the opening 107 and the holding element 112, introduced during a production step, can be compensated by adjusting the holding element 112 with respect to the carrier element 116.

FIG. 3 shows a schematic cross-sectional top view of the holding element 112 and the actuation element 120 shown in FIG. 2 being engaged with each other. As shown in FIG. 3, a diameter of the actuation element 120 is made larger than the gap between the first clip element 113 and the second clip element 115. Accordingly, the actuation element 120 applies a contact force on the clip elements 113 and 115, which points in a direction radially away from the actuation element 120. In the example of FIG. 3, a spring force originating from the elasticity of the split actuation element 120 creates the contact force. When the actuation element 120 is deformed by engaging with the holding element 112, an internal deformation resistance in the actuation element 120 works against the deformation, thereby creating the contact force.

By the created contact force, the clip elements 113 and 115 of the holding element 112 are pressed against the elongated sides of the opening 107 and are therefore forced to apply the holding force 126 on the carrier element 106. In an embodiment, the clip elements 113 and 115 are arranged at opposite sides of the actuation element 120, so that the horizontal force component of the holding force 126 points in opposite directions for each of the clip elements 113 and 115 as schematically shown in FIG. 3.

As can be further seen from FIG. 3, the actuation element 120 is not completely enclosed by the holding element 112, but only at the sides, where the clip elements 113 and 115 are arranged. Hence, the actuation element 120 is adjustable with respect to the holding element 112 in a direction, which is different from each of the directions in which the contact force is applied to the holding element 112. In this manner, a tolerance introduced for example in the fabrication process can be compensated, by adjusting the actuation element 120 with respect to the holding element 112 when the holding element 112 and the actuation element 120 are engaged.

In an embodiment, the direction in which the actuation element 120 is adjustable is perpendicular to the horizontal force component of the holding force 126 applied from the clip elements 113 and 115 on the carrier element 106. In this manner, it is provided that an adjustment of the actuation element 120 does not affect the holding force 126 applied from the holding element 112 to the carrier element 106.

FIG. 4 shows a schematic cross-sectional top view of a second example of the holding element 212 and the actuation element 220 before the assembly of the housing assembly 100. The second example mainly differs from the first example in that the clip elements 213 and 215 have a curved shape and are bent towards the inside of the opening 207. Furthermore, the actuation element 220 has a rectangular cross-shape. Similar as described for the first example of FIG. 2, the carrier element 206 may be adjusted with respect to the holding element 212 along the elongated sides 240 when arranging the carrier element 206 in the base portion 102.

Figure 5:
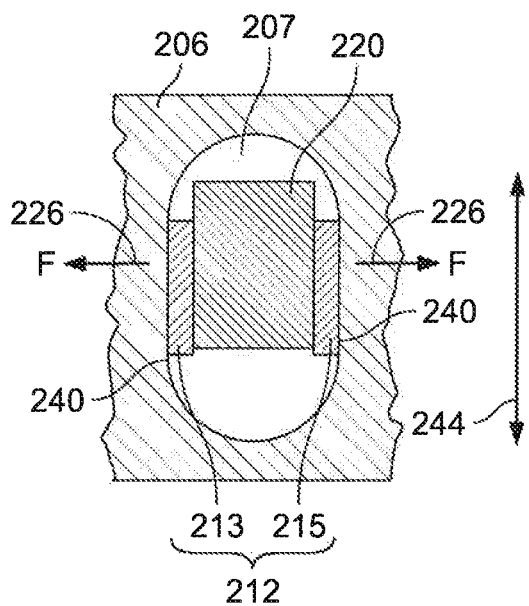
FIG. 5 is a sectional top view of the holding element and the actuation element of FIG. 4 engaged with each other.

FIG. 5 shows a schematic cross-sectional top view of the holding element 212 and the actuation element 220 of the second example shown in FIG. 4 being engaged with each other. As shown in FIG. 5, a width of the actuation element 220 is made larger than the gap between the clip elements 213 and 215 of the holding element 212. Accordingly, the actuation element 220 applies a contact force on the clip elements 213 and 215, which presses the clip elements 213 and 215 on the carrier element 206 towards the support element. Notably, the contact force applied by the rectangular actuation element 220 deforms the curved clip elements 213 and 215 in a way that an outer surface of each clip elements 213 and 215 is pressed against an elongated side 240 of the opening 207. The deformation of the clip elements 213 and 215 results in a spring force originating from the elasticity of the clip elements 213 and 215, which enhances the holding force 226 applied on the holding element 206. When the clip elements 213 and 215 are deformed by the elongated sides 240 of the opening 207 due to the contact force applied from the actuation element 220, an internal deformation resistance in the holding element 206 works against the deformation, thereby enhancing the holding force 226.

The arrow 244 in FIG. 5 indicates a direction in which the actuation element 220 is adjustable with respect to the clip elements 213 and 215 of the holding element 212 when the actuation element 220 is engaged with the holding element 212. Hereby, the direction 244 is perpendicular in an embodiment towards the horizontal force component of the holding force 226 applied from the clip elements 213 and 215 on the carrier element 206, so that the adjustment of the actuation element 220 does not affect the holding force 226 applied from the holding element 212 on the carrier element 206.

Figure 6:
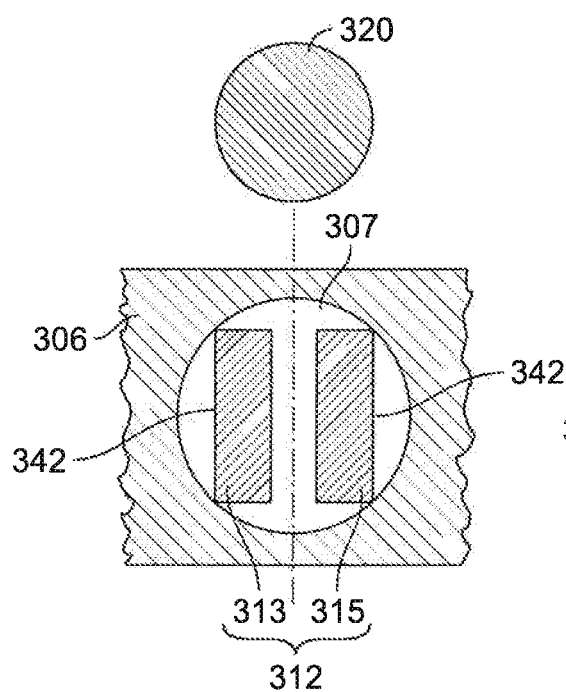
FIG. 6 is a sectional top view of a holding element and an actuation element according to another embodiment before assembly.

FIG. 6 shows a schematic cross-sectional top view of a third example of the holding element 312 and the actuation element 320 before the assembly of the housing assembly 200. The third example mainly differs from the first example in that the opening 307 of the carrier element 306 is a cut-out with a circular shape. The actuation element 320 in FIG. 6 has a circular cross-shape. However, an outer radius of the actuation element 320 is smaller than a radius of the circular opening 307, so that the actuation element 320 is adjustable within the opening 307 in at least one direction. As shown in FIG. 6, the contacting sides 342 of the clip elements 313 and 315 may only partially be in contact with the carrier element 306, when the carrier element 306 is arranged in the base portion 102.

Figure 7:
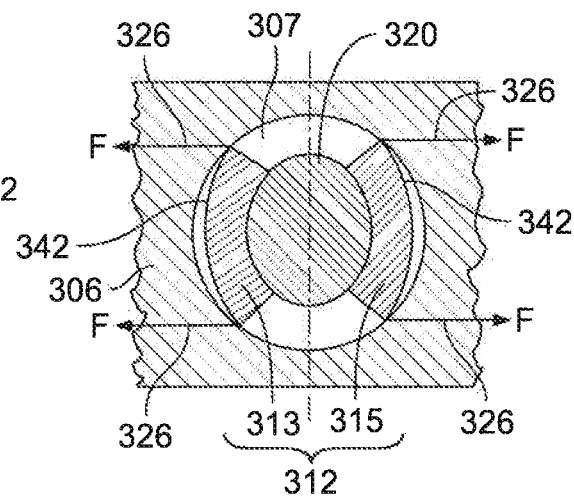
FIG. 7 is a sectional top view of the holding element and the actuation element of FIG. 6 engaged with each other.

FIG. 7 shows a schematic cross-sectional top view of the holding element 312 shown in FIG. 6 and an actuation element 320 having a circular cross section being engaged with each other. As shown in FIG. 7, the contacting sides 342 of the clip elements 313 and 315 may only partially be in contact with the carrier element 306, when the actuation element 320 is engaged with the holding element 312. The contact force applied from the actuation element 320 to the clip elements 313 and 315 is transmitted to contact regions between the clip elements 313 and 315 and the carrier element 306. A spring force originating from the elasticity of the clip elements 313 and 315 works against the deformation of the clip elements 313 and 315, and thereby generates the holding forces 326.

Figure 8:
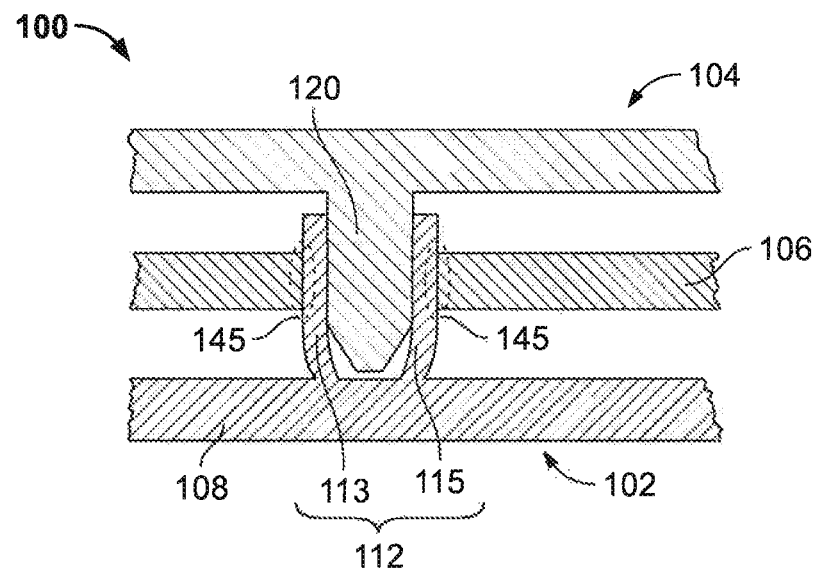
FIG. 8 is a sectional view of the housing assembly of FIG. 1.

FIG. 8 shows another cross-sectional view of the housing assembly 100. Notably, the introduced deformation of the clip elements 113 and 115 is not completely shown in FIG. 8. In the actual embodiment, the clip elements 113 and 115 are bent in the contact regions 145 with the carrier element 106 so that the holding force applied to the carrier element 106 has a vertical force component and a horizontal force component.

Figure 9:
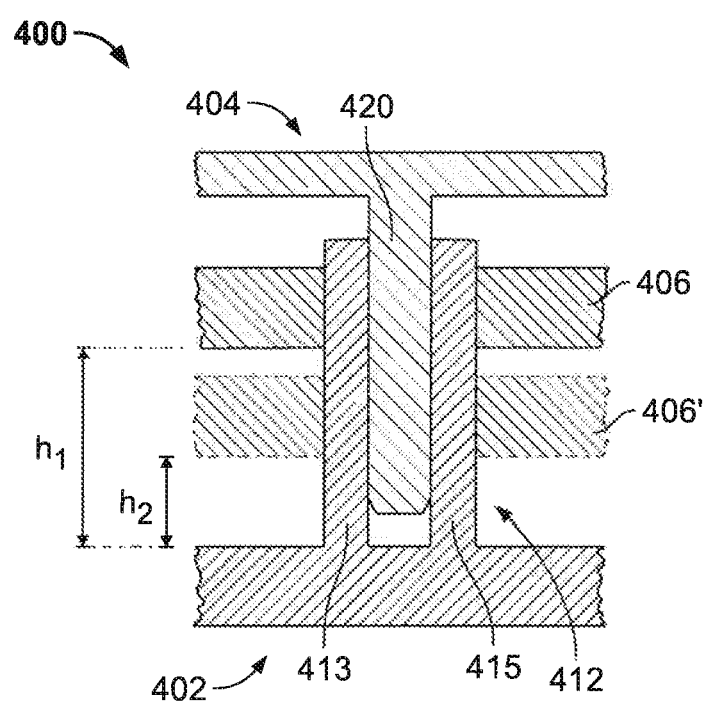
FIG. 9 is a sectional view of a housing assembly according to a second embodiment.

FIG. 9 shows a schematic cross-sectional view of the housing assembly 400 according to a second embodiment of the present invention. The housing assembly 400 comprises the base portion 402 and the cover portion 404. As schematically shown in FIG. 9, a height at which the carrier elements 406 or 406' are arranged at the holding element 412 is not restricted by the holding element 412, but may be determined by a height of support elements extending from the base portion 402 towards the cover portion 404.

In the embodiment shown in FIG. 9, the base portion 402 can provide several support elements, each differing in the height extending from the base portion 402 towards the cover portion 404 from each other. Accordingly, it is possible to arrange carrier elements 406, 406' having different shapes at different heights in the housing assembly 400. For example, the carrier element 406 having a shape corresponding to a first support element can be arranged at a height h1, which corresponds to the height of the first support element extending from the base portion 402.

Another carrier element 406' (indicated by the dashed circumference) having a shape corresponding to a second support element may be arranged at a different height h2, which corresponds to the height of the second support element extending from the base portion 402. The carrier element 406 may be held by a holding force, which presses the carrier element 406 against the first support element. The carrier element 406' may be held by a holding force, which presses the carrier element 406' against the second support element. An assembling height can be adapted to the functions of the components mounted onto the carrier element 406, 406'. For example, it is possible to assemble a magnetic sensor near the surface of the base portion 402, in order to reduce the size of a magnet included in the magnetic sensor.

Alternatively, each of the carrier elements 406 and 406' may be positioned and held in the base portion 402 by a mounting machine during the arrangement of the carrier element 406, 406' in the base portion 402, for example by an adjustable support element of the mounting machine. The adjustable support element can then be removed as soon as the actuation element 420 is engaged with the holding element 412 and each of the carrier elements 406 and 406' is firmly held at the foreseen height within the housing assembly.

Accordingly, it is not only possible to arrange single carrier elements at different heights in the housing assembly 400, but also to arrange a plurality of carrier elements 406 and 406' at different heights simultaneously in the housing assembly 400. Notably, the deformation introduced to the clip elements 413 and 415 is not completely shown in FIG. 9. In the actual embodiment, the clip elements 413 and 415 are bent by the introduced deformation in the contact regions with the carrier elements 406 and 406' so that the holding force applied to the carrier element 406 and 406' has a vertical force component and a horizontal force component.

Figure 10:
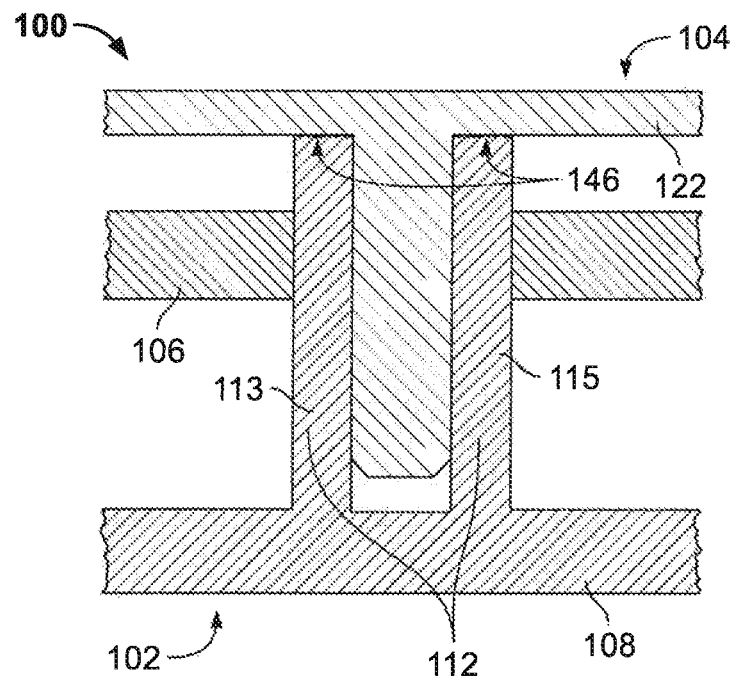
FIG. 10 is a sectional view of the housing assembly of FIG. 1.

As shown in FIG. 10, the clamping elements 113 and 115 of the holding element 112 may be brought in contact with the lid element 122, when the cover portion 104 is fixed to the base portion 102. Hence, additional fixing zones can be created at a peripheral region 146 of the holding element 112 (or at the peripheral regions of the clamping elements 113 and 115), which is in contact with the lid element 122. In an embodiment, the holding element 112 is fixed to the cover portion 104 by laser welding. However, also alternative fixation techniques, like gluing, ultrasonic welding, infrared welding, hotplate welding, punching or embossing may be used. The additional fixation at the peripheral region 146 directly works against the pushback force introduced by the engagement of the actuation element 120 with the holding element 112. Hence, the need of transferring the fixation force through the lid element 122 to the actuation element 120 is dispensed, so that the stress applied to the lid element 122 is reduced. In other words, the pre-stress applied to the actuation element 120 is directly generated by the fixation forces at the peripheral region 146 of the holding element 112.

Figure 11:
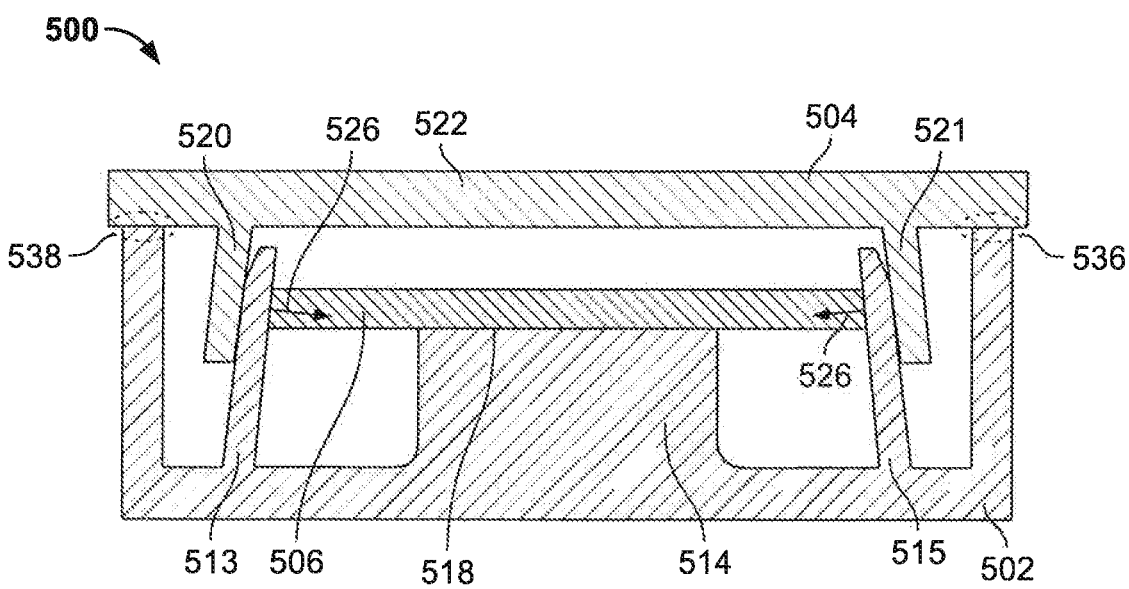
FIG. 11 is a sectional view of a housing assembly according to a third embodiment.

FIG. 11 shows a schematic cross-sectional view of the housing assembly 500 according to a third embodiment of the present invention. According to the third embodiment, the base portion 502 comprises a support element 514, which is arranged between the first clip element 513, which may also be signified as a first holding part, and the second clip element 515, which may also be signified as a second holding part, of the holding element. The cover portion 504 comprises an actuation element, which has a first actuation part 520 and a second actuation part 521. Each of the first actuation part 520 and the second actuation part 521 may be a pin, in an embodiment in conical form tapering towards a peripheral region. However, other geometries in line with the principles according to the present invention are also possible. For example, each of the actuation parts 520 and 521 may have a rectangular cross-shape comparable to the actuation element 220 in FIG. 5. Furthermore, also an asymmetric configuration with only a single actuation element, engaging with one of the first clip element 513 and the second clip element 515, is possible.

When the cover portion 504 is fixed to the base portion 502, the first actuation part 520 engages with the first clip element 513 and the second actuation part 521 engages with the second clip element 515 as shown in FIG. 11. The actuation parts 520 and 521 each have a misalignment with respect to the clip elements 513 and 515 in a direction towards the support element 514. Hence, when the cover portion 504 is fixed to the base portion 502, the actuation parts 520 and 521 apply a contact force on the clamping elements 513 and 515, which forces the clamping elements 513 and 515 to bend at least in a contact region with the carrier element 506 in the direction towards the support element 514.

In this manner, each of the clamping elements 513 and 515 is forced to press the carrier element 506 against the support element 514. Thereby, due to the bending of the clamping elements 513 and 515, the holding forces applied by the actuation parts 520 and 521 have a vertical force component and a horizontal force component. The support region 518 of the support element provides a counterforce for the vertical force components of the holding force 526, thus tightly clamping the carrier element 506 between the clamping elements 513 and 515 of the holding element and the support element 514. As the carrier element 506 is arranged between the first clamping elements 513 and the second clamping element 515, the need for providing cut-outs in the carrier elements 506 is dispensed in the third embodiment. In an embodiment, the clamping elements 513 and 515 are arranged at opposite sides of the carrier element 506, so that the horizontal force components of the holding forces 526 applied by each of the clamping elements 513 and 515 work against each other. In this manner, the stability of the carrier element 506 in the horizontal direction can be enhanced.

Furthermore, the actuation parts 520 and 521 are adjustable with respect to the corresponding clamping elements 513 and 515 in at least one direction, when the holding element is engaged with the actuation element, so that tolerances between the actuation parts and the clamping parts can be compensated. In an embodiment, this direction is perpendicular to the direction of the holding forces 526, so that the adjustment of the actuation parts 520, 521 has only a minor effect on the strength of the holding force. In an embodiment, the clamping elements 513 and 515 are also adjustable with respect to the holding element 506, when the holding element 506 is arranged in the base portion 502, in order to enhance the tolerance compensation effect. The contact force applied by each of the actuation parts 520 and 521 may be further enhanced by a pre-stress, which is applied by the lid element 522 or by fixation of the clamping elements 513 and 515 to the cover portion 504 as described above. The pre-stress may for example be increased by fixation devices fixing the cover portion 504 to the base portion 502 provided in fixation regions 536 and 538 at the outside of the cover portion 504.

Figure 12:
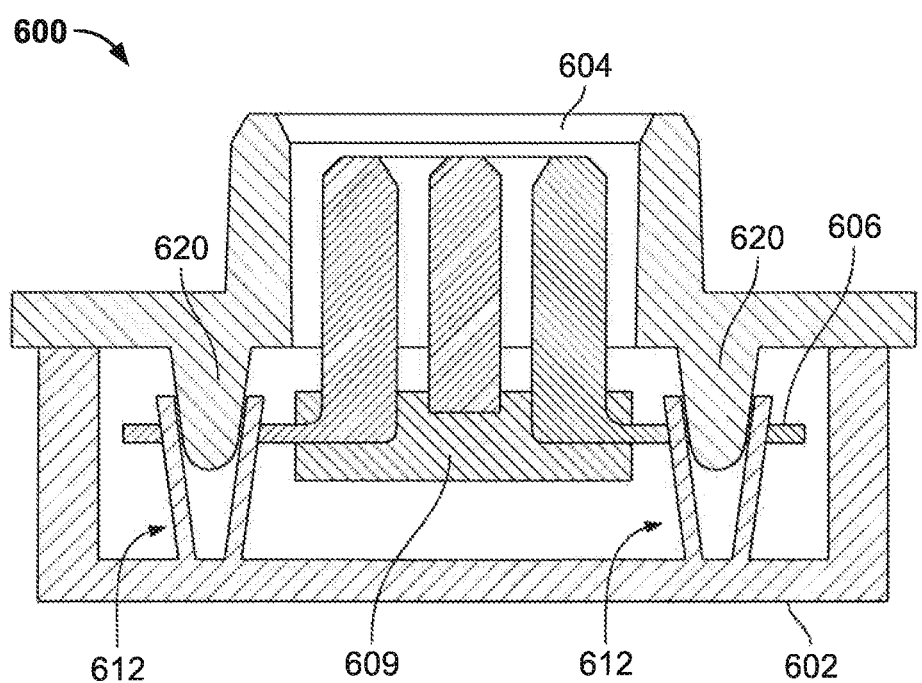
FIG. 12 is a sectional view of a housing assembly according to a fourth embodiment.

FIG. 12 shows a schematic cross-sectional view of the housing assembly 600 according to a fourth embodiment of the present invention. As schematically shown in FIG. 12, the carrier element 606 may be for example a lead frame, which carries a technical assembly, such as a sensor, a receptacle or pin of a connector or a motor. For example, the technical assembly can include at least one electronic component, which is joined with the lead frame by an overmold 609. Just as described for the other embodiments, the lead frame 606 may be held by holding elements 612 engaging with corresponding actuation elements 620. The base portion 602 may optionally comprise a support element for clamping the carrier element 606 between the holding elements 612 and the support element. The support element may be for example provided below the overmold 609.

In another embodiment, the lead frame 606 may be positioned and held by a mounting machine during the arrangement of the lead frame 606 in the base portion 602, for example by a support element of the mounting machine. The support element of the mounting machine may then be removed as soon as the holding elements 612 are engaged with the corresponding actuation elements 620, so that the lead frame 606 is firmly hold within the housing assembly 600. In this manner, accurate height positioning of the lead frame 606, the overmold 609, and the at least one electronic component carried by the lead frame 606 can be achieved.

Dimensions, types of materials, orientations of the various components, and the number and positions of the various components described herein are intended to define parameters of certain embodiments, and are by no means limiting and are merely example embodiments. For example, a housing assembly according to the present invention may comprise a plurality of holding elements, a plurality of corresponding actuation elements and a plurality of support elements in order to enhance the stability of the carrier element.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments.

For example, alternatively to the described embodiments, the base portion may comprise the actuation element, and the cover portion may comprise the holding element and the support element. The assembly of the housing may then be performed in the same manner as described so far, however with arranging the carrier element in the cover portion before fixing the cover portion to the base portion.

What is claimed is:

1. A housing assembly for a component, comprising:
a base portion having a holding element;
a cover portion having an actuation element; and
a carrier element carrying the component, the holding element holds the carrier element by engaging with the actuation element, the actuation element applies a contact force on the holding element and is adjustable with respect to the holding element in at least one direction when the holding element is engaged with the actuation element.

2. The housing assembly of claim 1, wherein the base portion has a support element arranged separated from the holding element.

3. The housing assembly of claim 2, wherein the contact force forces the holding element to press the carrier element against the support element.

4. The housing assembly of claim 3, wherein the support element includes a first support part and a second support part, the holding element is arranged between the first support part and the second support part.

5. The housing assembly of claim 1, wherein the actuation element is press fitted against the holding element.

6. The housing assembly of claim 1, wherein the cover portion has a lid element applying a pre-stress on the actuation element.

7. The housing assembly of claim 1, wherein the actuation element is a pin.

8. The housing assembly of claim 1, wherein the actuation element tapers toward a peripheral region.

9. The housing assembly of claim 1, wherein the carrier element has an opening and the holding element protrudes through the opening.

10. The housing assembly of claim 9, wherein the opening is an elongated cut-out and the holding element extends along an elongated side of the elongated cut-out.

11. The housing assembly of claim 1, wherein the holding element has a first clip element and a second clip element arranged at opposite sides of the actuation element.

12. The housing assembly of claim 11, wherein the first clip element and the second clip element each apply a first force component in a horizontal direction with respect to the carrier element and a second force component in a vertical direction with respect to the carrier element.

13. The housing assembly of claim 1, wherein the base portion has a pair of support elements differing in a height extending from the base portion.

14. The housing assembly of claim 1, wherein the holding element has a first holding part and a second holding part, the carrier element is arranged between the first holding part and the second holding part.

15. The housing assembly of claim 14, wherein the actuation element has a first actuation part and a second actuation part, the first actuation part applies the contact force on the first holding part and the second actuation part applies the contact force on the second holding part.

16. The housing assembly of claim 1, wherein a peripheral region of the holding element is fixed to the cover portion.

17. A method for assembling a component, comprising:
providing a base portion having a holding element, a cover portion having an actuation element, and a carrier element carrying the component;
arranging the carrier element in the base portion;
engaging the holding element with the actuation element, the holding element holding the carrier element; and
fixing the cover portion to the base portion such that the actuation element applies a contact force on the holding element, the actuation element is adjustable with respect to the holding element in at least one direction when the holding element is engaged with the actuation element.

18. The method of claim 17, wherein the holding element is adjustable with respect to the carrier element when engaging the holding element with the actuation element.

* * * * *